US011276772B2

(12) United States Patent
Mauder et al.

(10) Patent No.: US 11,276,772 B2
(45) Date of Patent: Mar. 15, 2022

(54) POWER SEMICONDUCTOR DEVICE

(71) Applicant: Infineon Technologies AG, Neubiberg (DE)

(72) Inventors: Anton Mauder, Kolbermoor (DE); Franz-Josef Niedernostheide, Hagen a. T.W. (DE); Christian Philipp Sandow, Haar (DE)

(73) Assignee: Infineon Technologies AG, Neubiberg (DE)

( * ) Notice: Subject to any disclaimer, the term of this patent is extended or adjusted under 35 U.S.C. 154(b) by 7 days.

(21) Appl. No.: 16/864,608

(22) Filed: May 1, 2020

(65) Prior Publication Data

US 2020/0259007 A1   Aug. 13, 2020

Related U.S. Application Data

(63) Continuation of application No. 16/424,968, filed on May 29, 2019, now Pat. No. 10,665,706, which is a
(Continued)

(30) Foreign Application Priority Data

Oct. 22, 2015   (DE) .......................... 102015117994.6

(51) Int. Cl.
H01L 29/66   (2006.01)
H01L 29/739   (2006.01)
(Continued)

(52) U.S. Cl.
CPC ...... H01L 29/7397 (2013.01); H01L 29/0607 (2013.01); H01L 29/0619 (2013.01);
(Continued)

(58) Field of Classification Search
CPC ............. H01L 29/7397; H01L 29/0607; H01L 29/0619; H01L 29/0623; H01L 29/0865;
(Continued)

(56) References Cited

U.S. PATENT DOCUMENTS 5,894,139 A   4/1999   Otsuki et al.
6,002,153 A   12/1999   Tsunoda et al.
(Continued)

FOREIGN PATENT DOCUMENTS

CN   1950947 A   4/2007
CN   102810552 A   12/2012
(Continued)

OTHER PUBLICATIONS

Sumitomo, Masakiyo, et al., "Low loss IGBT with Partially Narrow Mesa Structure (PNM-IGBT)", Proceedings of the 2012 24th International Symposium on Power Semiconductor Devices and ICs, Bruges, Belgium, Jun. 3-7, 2012, pp. 17-20.

Primary Examiner — Tan N Tran
(74) Attorney, Agent, or Firm — Murphy, Bilak & Homiller, PLLC

(57) ABSTRACT

A power semiconductor transistor includes: a semiconductor body coupled to a load terminal; a drift region in the semiconductor body and having dopants of a first conductivity type; a first trench extending into the semiconductor body along a vertical direction and including a control electrode electrically insulated from the semiconductor body by an insulator; a second trench extending into the semiconductor body along the vertical direction; a mesa region arranged between the trenches and including a source region electrically connected to the load terminal and a channel region separating the source and drift regions; and a portion of a contiguous plateau region of a second conductivity type arranged in the semiconductor drift region and extending below the trenches and below the channel and source
(Continued)

regions, the contiguous plateau region having a plurality of openings aligned below the channel region in a widthwise direction of the channel region.

20 Claims, 6 Drawing Sheets

Related U.S. Application Data continuation of application No. 15/854,478, filed on Dec. 26, 2017, now Pat. No. 10,326,009, which is a continuation of application No. 15/331,415, filed on Oct. 21, 2016, now Pat. No. 9,859,408.

(51) Int. Cl.
*H01L 29/06* (2006.01)
*H01L 29/08* (2006.01)
*H01L 29/10* (2006.01)
*H01L 29/423* (2006.01)
*H01L 29/78* (2006.01)

(52) U.S. Cl.
CPC ...... *H01L 29/0623* (2013.01); *H01L 29/0865* (2013.01); *H01L 29/1033* (2013.01); *H01L 29/1095* (2013.01); *H01L 29/4236* (2013.01); *H01L 29/66348* (2013.01); *H01L 29/66734* (2013.01); *H01L 29/7813* (2013.01); *H01L 29/0696* (2013.01)

(58) Field of Classification Search
CPC ............ H01L 29/1033; H01L 29/1095; H01L 29/4236; H01L 29/66348; H01L 29/66734; H01L 29/7813
USPC .................................. 257/300, 331, 332, 334
See application file for complete search history.

(56) References Cited

U.S. PATENT DOCUMENTS

| | | | |
|---|---|---|---|
| 6,049,108 A | 4/2000 | Williams et al. | |
| 6,891,224 B2* | 5/2005 | Ogura | H01L 29/0692 |
| | | | 257/329 |
| 6,913,977 B2* | 7/2005 | Pattanayak | H01L 29/0878 |
| | | | 438/270 |
| 7,294,885 B2 | 11/2007 | Tihanyi | |
| 9,024,413 B2 | 5/2015 | Laven et al. | |
| 9,105,679 B2* | 8/2015 | Laven | H01L 29/7397 |
| 9,621,133 B2 | 4/2017 | Laven et al. | |
| 9,859,408 B2 | 1/2018 | Mauder et al. | |
| 10,153,275 B2 | 12/2018 | Laven et al. | |
| 10,326,009 B2 | 6/2019 | Mauder et al. | |
| 2004/0041171 A1 | 3/2004 | Ogura et al. | |
| 2005/0054177 A1 | 3/2005 | Pattanayak | |
| 2008/0179666 A1 | 7/2008 | Foerster et al. | |
| 2009/0057713 A1* | 3/2009 | Hirler | H01L 29/1095 |
| | | | 257/143 |
| 2010/0267209 A1 | 10/2010 | Ooki | |
| 2010/0289059 A1 | 11/2010 | Hsieh | |
| 2012/0018846 A1 | 1/2012 | Baburske et al. | |
| 2012/0104555 A1 | 5/2012 | Bobde et al. | |
| 2014/0197876 A1 | 7/2014 | Laven et al. | |
| 2015/0014743 A1 | 1/2015 | Werber et al. | |
| 2015/0015309 A1 | 1/2015 | Werber | |
| 2015/0091052 A1 | 4/2015 | Laven et al. | |
| 2015/0162406 A1 | 6/2015 | Laven et al. | |
| 2015/0162407 A1 | 6/2015 | Laven et al. | |
| 2015/0228723 A1 | 8/2015 | Werber et al. | |
| 2015/0279985 A1 | 10/2015 | Philippou et al. | |
| 2015/0295034 A1 | 10/2015 | Laven et al. | |
| 2015/0380511 A1 | 12/2015 | Irsigler et al. | |
| 2016/0190123 A1 | 6/2016 | Laven et al. | |
| 2016/0352326 A1 | 12/2016 | Laven et al. | |
| 2016/0359026 A1 | 12/2016 | Matsuura | |
| 2017/0018548 A1 | 1/2017 | Laven et al. | |
| 2017/0018633 A1 | 1/2017 | Baburske et al. | |
| 2017/0162682 A1 | 6/2017 | Laven | |

FOREIGN PATENT DOCUMENTS

| | | |
|---|---|---|
| DE | 102007003812 A1 | 8/2008 |
| DE | 102011052731 A1 | 3/2012 |
| DE | 102012209188 A1 | 12/2012 |
| DE | 102014226161 B4 | 10/2017 |
| EP | 0746030 A2 | 12/1996 |
| WO | 2012120359 A2 | 9/2012 |

* cited by examiner

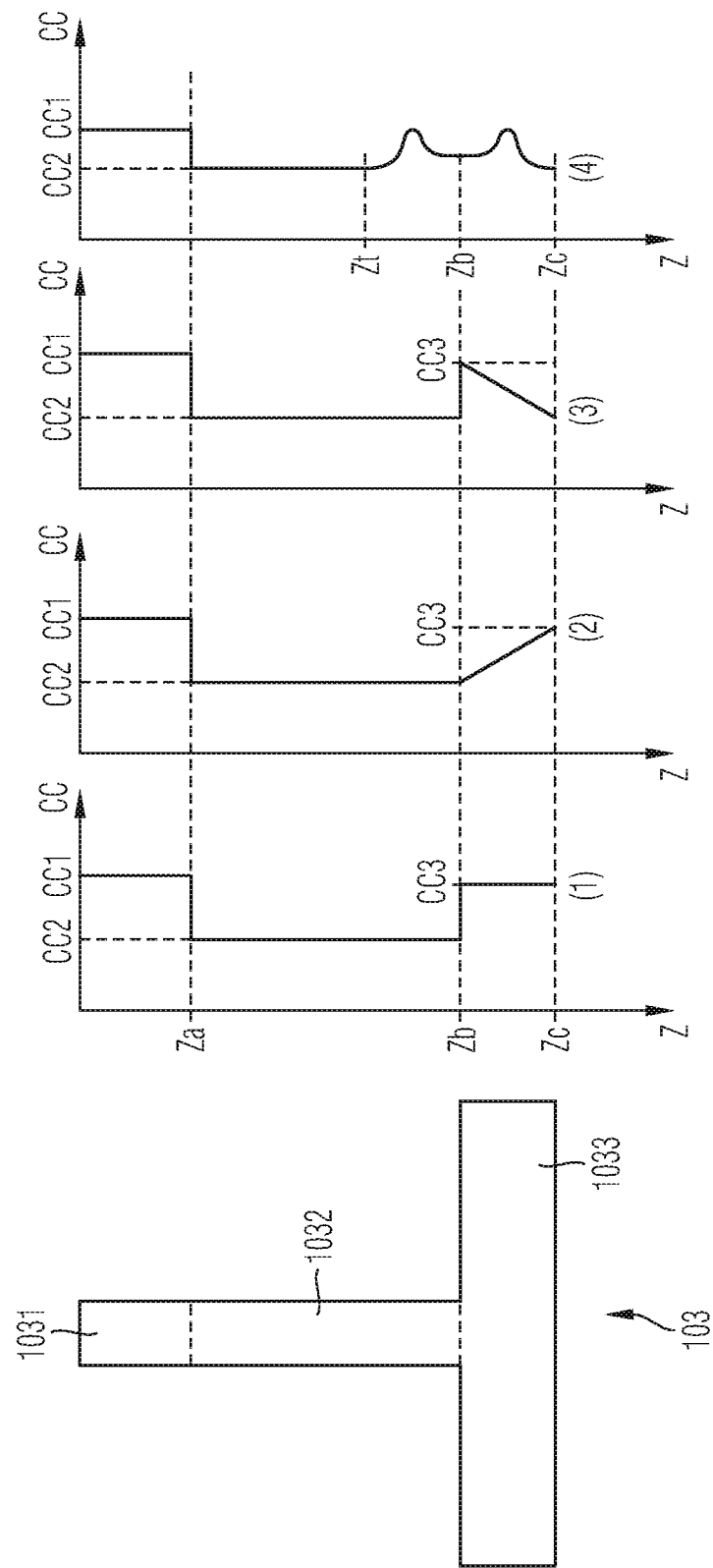

POWER SEMICONDUCTOR DEVICE

TECHNICAL FIELD

This specification refers to embodiments of a power semiconductor transistor and to embodiments of a method of processing a power semiconductor transistor. In particular, this specification refers to embodiments of a power semiconductor transistor, e.g., an IGBT, having a fully depleted channel region and to corresponding processing methods.

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

For example, such a power semiconductor transistor comprises a plurality of MOS control heads, wherein each control head may have at least one trench gate electrode and a source region and a channel region arranged adjacent thereto. For setting the transistor into a conducting state during which a load current in a forward direction may be conducted, the gate electrode may be provided with a control signal having a voltage within a first range so as to induce an inversion channel within the channel region. For setting the transistor into a blocking state during which a forward voltage may be blocked and flow of the load current in the forward direction is avoided, the gate electrode may be provided with the control signal having a voltage within a second range different from the first range so as to induce a depletion region at a pn-junction formed by a transition between the channel region and a drift region of the transistor, wherein the depletion region is also called "space charge region" and may mainly expand into the drift region of the transistor. The channel region in this context frequently is also referred to as a "body region", in which said inversion channel may be induced by the control signal to set the transistor in the conducting state. Without the inversion channel, the channel region forms a blocking pn-junction with the drift region.

During the time when the control signal provided to the gate electrode has a voltage within the second range, the transistor shall usually not go over to the conducting state. An uncontrolled change of state can result in a malfunction or even a destruction of the transistor.

SUMMARY

According to an embodiment, a power semiconductor transistor comprises a semiconductor body coupled to a first load terminal, the transistor further having: a semiconductor drift region included in the semiconductor body and having dopants of a first conductivity type; a first trench extending into the semiconductor body along a vertical direction, the first trench including a first control electrode electrically insulated from the semiconductor body by a first insulator, wherein the first trench is laterally confined by two first trench sidewalls and vertically confined by a first trench bottom; a first source region arranged laterally adjacent to one of the first trench sidewalls and being electrically connected to the first load terminal; a first semiconductor channel region included in the semiconductor body and arranged laterally adjacent to the same first trench sidewall as the first source region, the first semiconductor channel region having dopants of a second conductivity type and isolating the first source region from the drift region; a second trench extending into the semiconductor body along the vertical direction, wherein the second trench is laterally confined by two second trench sidewalls and vertically confined by a second trench bottom; a guidance zone electrically connected to the first load terminal and extending deeper into the semiconductor body than the first trench bottom, the guidance zone being arranged separately from the first semiconductor channel region and adjacent to each of the other of the two first trench sidewalls and one of the second trench sidewalls, wherein, in a section arranged deeper than the first trench bottom, the guidance zone extends laterally towards the first semiconductor channel region. A distance along a first lateral direction between said first trench sidewall and said second trench sidewall amounts to less than 100 nm.

According to a further embodiment, a power semiconductor transistor comprises a semiconductor body coupled to a first load terminal, the transistor further having: a semiconductor drift region included in the semiconductor body and having dopants of a first conductivity type; a pair of trenches extending into the semiconductor body along a vertical direction, each trench including a control electrode electrically insulated from the semiconductor body by an insulator, and each trench being laterally confined by two trench sidewalls and vertically confined by a trench bottom; source regions arranged laterally adjacent to a respective outer one of the trench sidewalls of the pair of trenches and being electrically connected to the first load terminal; semiconductor channel regions included in the semiconductor body and arranged laterally adjacent to the respective same outer trench sidewall as the source regions, the semiconductor channel regions having dopants of a second conductivity type and isolating the source regions from the drift region; and a guidance zone electrically connected to the first load terminal and extending deeper into the semiconductor body than the trench bottoms, the guidance zone being arranged separately from the semiconductor channel regions and adjacent to each of the inner ones of trench sidewalls of the pair of trenches, wherein, in a section arranged deeper than the trench bottoms, the guidance zone extends laterally towards each of the semiconductor channel regions.

According to another embodiment, a method of producing a power semiconductor transistor comprises providing a semiconductor body coupled to a first load terminal, wherein the method further includes forming the following components: a semiconductor drift region included in the semiconductor body and having dopants of a first conductivity type; a first trench extending into the semiconductor body along a vertical direction, the first trench including a first control electrode electrically insulated from the semiconductor body by a first insulator, wherein the first trench is laterally confined by two first trench sidewalls and vertically confined by a first trench bottom; a first source region arranged laterally adjacent to one of the first trench sidewalls and being electrically connected to the first load terminal; a first semiconductor channel region included in the semiconductor body and arranged laterally adjacent to the same first trench sidewall as the first source region, the first semiconductor channel region having dopants of a second conductivity type and isolating the first source region from the drift region; a second trench extending into the semiconductor body along the vertical direction, wherein the second trench is laterally confined by two second trench sidewalls and vertically confined by a second trench bottom; a guidance zone electrically connected to the first load terminal and extending deeper into the semiconductor body than the first trench bottom, the guidance zone being arranged separately from the first semiconductor channel region and adjacent to each of the other of the two first trench sidewalls and one of the second trench sidewalls, wherein, in a section arranged deeper than the first trench bottom, the guidance zone extends laterally towards the first semiconductor channel region. A distance along a first lateral direction between said first trench sidewall and said second trench sidewall amounts to less than 100 nm.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIG. 6 schematically illustrates a section of a vertical cross-section of a guidance zone of a power semiconductor transistor together with examples of dopant concentration profiles in accordance with one or more embodiments.

DETAILED DESCRIPTION

Figure 1:
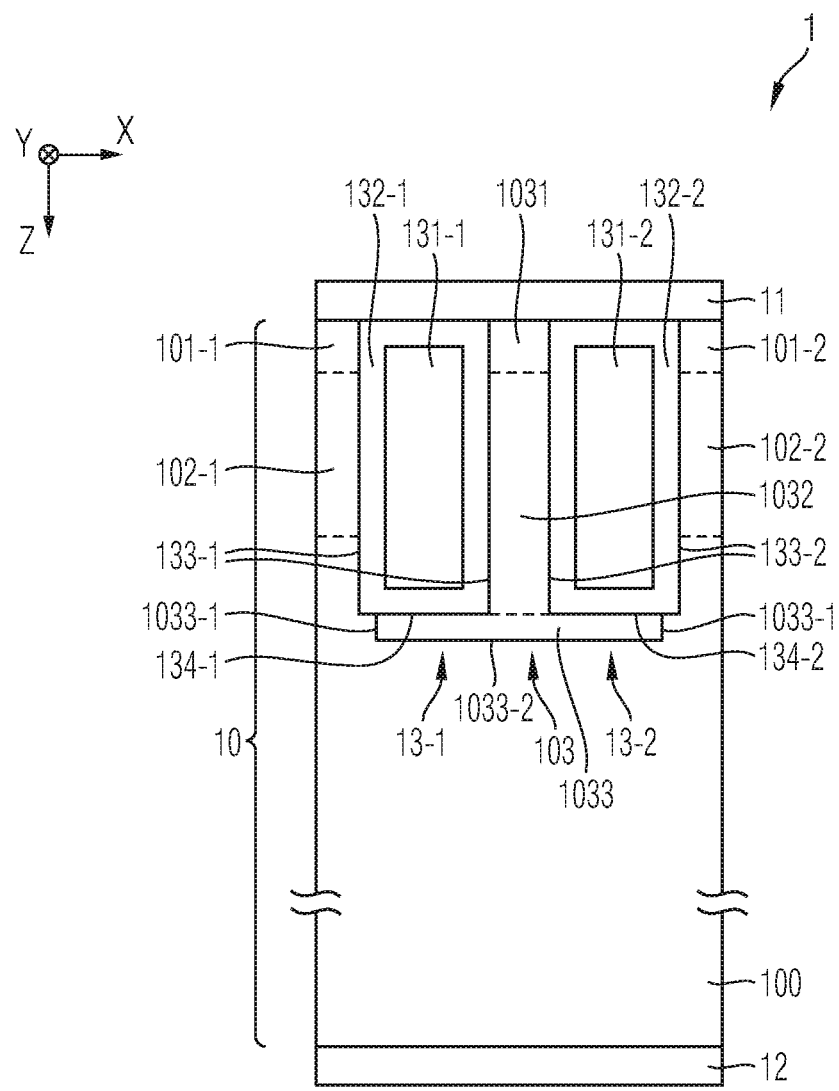
FIG. 1 schematically illustrates a section of a vertical cross-section of a power semiconductor transistor in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom" "below", "front", "behind" "back", "leading", "trailing" "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor region, such as the semiconductor body mentioned below. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be a vertical direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

Further, within this specification, the term "dopant concentration" may refer to an average dopant concentration or, respectively, to a mean dopant concentration or to a sheet charge carrier concentration of a specific semiconductor region or semiconductor zone. Thus, e.g., a statement saying that a specific semiconductor region exhibits a certain dopant concentration that is higher or lower as compared to a dopant concentration of another semiconductor region may indicate that the respective mean dopant concentrations of the semiconductor regions differ from each other.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

Specific embodiments described in this specification pertain to, without being limited thereto, a power semiconductor transistor (in the following simply also referred to as "transistor") that may be used within a power converter or a power supply. For example, the transistor may comprise one or more power semiconductor cells, such as a monolithically integrated transistor cell, and/or a monolithically integrated IGBT cell, and/or a monolithically integrated MOS Gated Diode (MGD) cell, and/or a monolithically integrated MOSFET cell and/or derivatives thereof. Such diode cells and such transistor cells may be integrated in a power semiconductor module.

The term "power semiconductor transistor" as used in this specification intends to describe a semiconductor transistor on a single chip with high voltage blocking and/or high current-carrying capabilities. In other words, such power semiconductor transistor is intended for high current, typically in the Ampere range, e.g., up to several ten or hundred Ampere, and/or high voltages, typically above 5 V, or above 15 V or more typically 400V and above, e.g., up to some 1000 Volts.

Each of FIGS. 1 to 4 and 6 schematically illustrates a section of a vertical cross-section of a power semiconductor transistor 1 (in the following also referred to as "transistor") in accordance with one or more embodiments. The illustrated vertical cross-sections of FIGS. 1 to 4 and 6 may be in parallel to a plane defined by a vertical direction Z and first lateral direction X perpendicular thereto. FIGS. 5A-5B schematically illustrate sections of two horizontal cross-sections of a transistor 1 in accordance with several embodiments, wherein the horizontal cross-sections may be in parallel to a plane defined by the first lateral direction X and a second lateral direction Y perpendicular to each of the first lateral direction X and the vertical direction Z.

In the following, features of the embodiments according to FIGS. 1 to 6 will be explained in more detail.

The transistor 1 comprises a semiconductor body 10 coupled to a first load terminal 11. The semiconductor body 10 may further be coupled to a second load terminal 12. A first trench 13-1 and a second trench 13-2 extend into the semiconductor body 10 along the vertical direction Z, wherein the first trench 13-1 is laterally confined, along the first lateral direction X, by two first trench side walls 133-1, and vertically confined by a first trench bottom 134-1. Analogously, the second trench 13-2 is laterally confined, along the first lateral direction X, by two second trench sidewalls 133-2 and vertically confined by a second trench bottom 134-2.

The first trench 13-1 and the second trench 13-2 may form a pair of adjacent trenches, wherein one of the respective two trench sidewalls 133-1, 133-2 forms an outer trench sidewall (e.g. in FIG. 1, the left one of the first two trench sidewalls 133-1, and the right one of the second two trench sidewalls 133-2), and wherein the other one of the respective two trench sidewalls 133-1, 133-2 forms an inner trench sidewall (e.g., in FIG. 1, the right one of the two first trench sidewalls 133-1, and the left one of the two second trench sidewalls 133-2).

The first trench 13-1 may include a first control electrode 131-1 and a first insulator 132-1 that electrically insulates the first control electrode 131-1 from the semiconductor body 10. Analogously, the second trench 13-2 may include a second control electrode 131-2 and a second insulator 132-2 that electrically insulates the second control electrode 131-2 from the semiconductor body 10.

The first control electrode 131-1 and the second control electrode 131-2 may be electrically connected to each other. Further, each of the first control electrode 131-1 and the second control electrode 131-2 may be electrically connected to a control terminal (not illustrated) for receiving a control signal. For example, such control signal may be generated by applying a voltage between the first load terminal 11 and said control terminal electrically connected to each of the control electrodes 131-1 and 131-2.

The transistor 1 may further comprise a semiconductor drift region 100 included in the semiconductor body 10, a first source region 101-1 arranged laterally adjacent to one of the first trench side walls 133-1 and a first semiconductor channel region 102-1 also included in the semiconductor body 10 and arranged laterally adjacent to the same first trench sidewall 133-1 as the first source region 101-1. Said one of the first trench side walls 133-1 can be the outer first trench sidewall of the pair of trenches 13-1, 13-2.

The semiconductor drift region 100 (in the following also referred to as "drift region") has dopants of a first conductivity type. For example, the semiconductor drift region 100 is a weakly doped n-region (n⁻-region). For example, the dopant concentration of the semiconductor drift region 100 is within the range of $10^{10}$ cm$^{-3}$ to $10^{17}$ cm$^{-3}$ or within the range of $10^{12}$ cm$^{-3}$ to $5*10^{14}$ cm$^{-3}$.

The first source region 101-1 can also be a semiconductor region that comprises dopants of the first conductivity type. For example, a first source region 101-1 is a highly doped n-region (n⁺-region). The dopant concentration of the first source region 101-1 can be within the range of the $10^{19}$ cm$^{-3}$ to $10^{21}$ cm$^{-3}$. The first source region 101-1 is electrically connected to the first load terminal 11. In accordance with another embodiment, the first source region 101-1 is a metal source region.

The first semiconductor channel region 102-1 (in the following also referred to as "first channel region") has dopants of a second conductivity type complementary to the first conductivity type and isolates the first source region 101-1 from the drift region 100. For example, the first semiconductor channel region 102-1 is a p-doped region. For example, the dopant concentration of the first semiconductor channel region 102-1 is within the range of $10^{11}$ cm$^{-3}$ to $10^{13}$ cm$^{-3}$.

As schematically illustrated in each of FIGS. 1 to 5, the transistor 1 may also comprise a second source region 101-2 and a second semiconductor channel region 102-2 arranged adjacent to the outer one of the two second trench sidewalls 133-2. What has been stated above regarding dopant types and dopant concentration of the first source region 101-1 and the first semiconductor channel region 102-1 may equally apply to the second source region 101-2 and the second semiconductor channel region 102-2.

The first control electrode 131-1 included within the first trench 13-1 may extend further along the vertical direction Z than the first semiconductor channel region 102-1. For example, the first semiconductor channel region 102-1 and the first control electrode 131-1 exhibit common vertical extension range along the vertical direction Z amounting to 100% of the total vertical extension range of the first semiconductor channel region 102-1. Further, the first source region 101-1 and the first control electrode 131-1 exhibit a common vertical extension range along the vertical direction Z amounting to at least 25% of the total vertical extension range of the first source region 101-1. Said proportions may equally apply to the second control electrode 131-2, the second source region 101-2 and the second semiconductor channel region 102-2.

According to another example, the first source region 101-1 and the first control electrode 131-1 exhibit a common vertical extension range along the vertical direction Z amounting to more than 0 nm and, e.g., to less than 1 μm.

For example, the first load terminal 11 is arranged on a frontside of the semiconductor body 10 and includes a first metallization layer. The second load terminal 12 may be arranged on a backside of the semiconductor body 10 and may include a second metallization layer. The semiconductor body 10 may be arranged between the first load terminal 11 and the second load terminal 12.

The semiconductor body 10 can be configured to conduct a load current in a forward direction, e.g., in the vertical direction Z, between said load terminals 11 and 12. To this end, the first control electrode 131-1 may be configured to induce, in response to receiving a control signal, an inversion channel for conducting at least a part of the load current within the first semiconductor channel region 102-1. In response to receiving such control signal, the transistor 1 can be configured to simultaneously fully deplete the first semiconductor channel region 102-1 regarding mobile charge carriers of the second conductivity type.

In accordance with an embodiment, the first load terminal 11 is a source terminal (also referred to as "emitter terminal") and the second load terminal 12 is a drain terminal (also referred to as "collector terminal") and the control terminal (not illustrated) electrically connected to the first control electrode 131-1 is a gate terminal.

The drift zone 100, the first source region 101-1, the first semiconductor channel region 102-1 and the first control electrode 131-1 may be configured to form a MOS control head of the transistor 1, e.g., a trench gate MOS power control head.

For example, for setting the transistor 1 into a conducting state in which the load current between the load terminals 11, 12 may be conducted in a forward direction (e.g. in the vertical direction Z), the first control electrode 131-1 may be provided with a control signal having a voltage within a first range so as to induce said inversion channel within a first semiconductor channel region 102-1. For example, the voltage is applied between the first load terminal 11 and the first control electrode 131-1. In an embodiment, the electrical potential of the first control electrode 131-1 is greater than the electrical potential of the first load terminal 11 if the applied voltage is within the first range.

For setting the transistor 1 into a blocking state in which a voltage applied between the second load terminal 12 and the first load terminal 11 in the same direction to the forward direction may be blocked and flow of the load current in the forward direction is prevented, the first control electrode 131-1 may be provided with the control signal having a voltage within the second range different from the first range so as to induce a depletion region at a pn-junction formed by a transition between the first semiconductor channel region 102-1 and the semiconductor drift region 100 of the transistor 1. For example, the voltage is applied between the first load terminal 11 and the first control electrode 131-1, In an embodiment, the electrical potential of the first control electrode 131-1 is equal to or lower than the electrical potential of the first load terminal 11 if the applied voltage is within the second range.

For example, the structure as schematically illustrated in each of FIGS. 1 to 6 can be employed for forming one or more transistors cells of an IGBT, an RC-IGBT, a MOSFET and the like. In an embodiment, the transistor 1 is one of an IGBT, an RC-IGBT or a MOSFET.

Again, what has been stated above about the first control electrode 131-1, the first semiconductor channel region 102-1 and the first source region 101-1 may equally apply to the second semiconductor channel region 102-2, the second source region 101-2 and the second control electrode 131-2.

It shall be understood that the semiconductor body 10 may include further semiconductor regions, e.g., a drift region and/or a field stop region and further regions that are commonly employed within power semiconductor transistor structures. For example, the semiconductor body 10 may be coupled to the second load terminal 12 via one or more doped regions of the first and/or second conductivity type. However, in this specification, emphasis is placed on the components arranged in proximity to the first load terminal 11 that have been described above.

It shall further be understood that the first trench 13-1 and the second trench 13-2 may exhibit lateral and vertical dimensions substantially identical to each other, Thus, the first trench 13-1 and the second trench 13-2 may equally extend along the vertical direction Z and equally along the first lateral direction X, The same applies to the first control electrode 131-1 and the second control electrode 131-2 and to the first and second insulator 132-1, 132-2.

The transistor 1 may further comprise a guidance zone 103 that is electrically connected to the first load terminal 11. For example, the guidance zone 103 is arranged separately from a first semiconductor channel region 102-1 and separately from the second semiconductor channel region 102-2 and adjacent to each of the other one of the two first trench sidewalls 133-1 and the two second trench sidewalls 133-2. For example, the guidance zone 103 may be arranged adjacent to each of the inner ones of the trench sidewalls 133-1 and 133-2 of the first trench 13-1 and the second trench 13-2.

In an embodiment, the guidance zone 103 is a contiguous semiconductor zone. For example, the guidance zone 103 comprises dopants of the same type as the semiconductor channel regions 102-1 and 102-2. Thus, the guidance zone 103 may comprise dopants of the second conductivity type. E.g., the guidance zone 103 may be a p-doped region, wherein its dopant concentration may vary along the vertical direction Z, which will be explained in more detail below.

For example, the guidance zone 103 forms the transition between the inner ones of the trench sidewalls 133-1 and 133-2. In other words, the guidance zone 103 in the vertical cross-sections schematically illustrated in each of FIGS. 1 to 4 may cover or, respectively, fill the region laterally confined by the inner one of the first two trench sidewalls 133-1 and the inner one of the second trench sidewall 133-2 of the pair of trenches 13-1, 13-2.

In accordance with an embodiment, the semiconductor channel regions 102-1 and 102-2 are fully depleted zones. For example, the semiconductor channel regions 102-1 and 102-2 are fully depleted by setting the control electrodes 131-1 and 131-2 to an appropriate voltage with respect to, e.g., the voltage of the first load terminal 11. Occasionally, such fully depleted zones are also referred to as "fully depletable zones". For example, if the transistor 1 is set into the conducting state, e.g., by applying a positive voltage between the control electrodes 131-1 and 131-2 and the first load terminal 11 (e.g., electrical potential of the control electrodes 131-1 and 131-2 is greater than the electrical potential of the first load terminal 11), the channel regions 102-1 and 102-2 become fully depleted and there are significantly less mobile charge carriers of the second conductivity type, e.g., holes, present within the channel regions 102-1 and 102-2. For example, the formulation "significantly less mobile charge carriers of the second conductivity type" intends to describe, in this specification, that the amount of mobile charge carriers of the second conductivity type is less than 10% of the mobile charge carriers of the first conductivity type.

In accordance with an embodiment, the transistor 1 is configured to fully deplete the channel regions 102-1 and 102-2 if a voltage applied between the control electrodes 131-1, 131-2 and the first load terminal 11 is within said first range, e.g., within a range of −3 V to +3 V. According to another embodiment, the transistor 1 is configured to fully deplete the channel regions 102-1 and 102-2 if an electric field applied between the control electrodes 131-1, 131-2 and the first load terminal 11 is within a first range, e.g., within a range of −10 MV/cm to +10 MV/cm or within a range of −6 MV/cm to +6 MV/cm.

The guidance zone 103 may comprise a contact section 1031 electrically connected to the first load terminal and a bar section 1032 arranged below the contact section 1031. The bar section 1032 may exhibit a dopant concentration within the range of $10^{15}$ cm$^{-3}$ to $10^{13}$ cm$^{-3}$.

Further, a mean distance along the first lateral direction X between the inner ones of the trench sidewalls 133-1 and 133-2 may be within the range of 3 nm to 80 nm.

In the following, features of exemplary embodiments of the guidance zone 103 will be presented.

In accordance with an embodiment, the guidance zone 103 extends deeper into the semiconductor body 10 along the vertical direction Z than the first trench bottom 134-1.

Further, in the section arranged deeper than the first trench bottom 134-1, the guidance zone 103 extends laterally towards the first semiconductor channel region 102-1. Further, the guidance zone 103 may comprise a section that is arranged deeper than the second trench bottom 134-2 and that may extend laterally towards the second semiconductor channel region 102-2. In the following, the section of the guidance zone 103 that is arranged deeper than at least one of the first trench bottom 134-1 and the second trench bottom 134-2 and that laterally extends towards at least one of the first semiconductor channel region 102-1 and the second semiconductor channel region 102-2 is referred to a plateau section 1033.

For example, the guidance zone 103 is configured to guide the electrical potential of the first load terminal 11 to its lateral extremities 1033-1 and to its vertical extremity 1033-2. Thereby, the electrical potential of the first load terminal 11 can be guided in proximity to a bottom of the first semiconductor channel region 102-1 and/or to the bottom of the second semiconductor channel region 102-2. Of course, since the electric conductivity of the guidance zone 103 is finite, the electrical potential may slightly change in value when being guided to the extremities 1033-1, 1033-2. In an embodiment, an integral dopant concentration along the vertical direction Z of the plateau section 1033 of the guidance zone 103 is, e.g., in a range of $10^{12}$ cm$^{-2}$ to $10^{15}$ cm$^{-2}$, starting, e.g., at a depth level of one of the first and second trench bottom 134-1, 134-2. Further optional aspects of exemplary dopant profiles of the guidance zone 103 will be elucidated with respect to FIG. 6.

The first trench 13-1 and the plateau section 1033 may exhibit a common lateral extension range that amounts to at least 75% of the total extension of the first trench bottom 134-1 along the first lateral direction X.

Analogously, the plateau section 1033 and the second trench 13-2 may exhibit a common lateral extension range amounting to at least 75% of the total extension of the second trench bottom 134-2 along the first lateral direction X. As will be explained in more detail with regards to FIGS. 5A-5B, the common lateral extension ranges may even be greater than 75%. For example, the plateau section 1033 may laterally extend even beyond the outer ones of the trench sidewalls 133-1 and 133-2.

As schematically illustrated in FIG. 1, in the vertical cross-section of the transistor 1, the guidance zone 103 may cover the entire area between the inner one of the first two trench sidewalls 133-1 and the inner one of the second two trench sidewalls 133-2. For example, the part of the guidance zone 103 laterally confined by the inner ones of the trench sidewalls 133-1, 133-2 may be constituted by the contact section 1031 and the bar section 1032, wherein the bar section 1032 and the contact section 1031 may cover, in the vertical cross-section of the transistor 1, the entire area between the first trench 13-1 and the second trench 13-2.

For example, the distance along the first lateral direction X between the inner ones of the trench sidewalls 131-1 and 133-2 amounts to less than 100 nm, to less than 70 nm, to less than 50 nm, or to even to less than 40 nm. Said distance may also be referred to as "mesa width" along the first lateral direction X. This mesa width may amount to less than 50% of the total extension of the first trench 13-1 along the first lateral direction X (i.e., the trench width), to less than 40%, to less than 30% or even to less than 25%.

Further, the guidance zone 103 may be separated from each of the first semiconductor channel region 102-1 and the second semiconductor channel region 102-2 by means of the semiconductor drift region 100. Thus, in accordance with an embodiment, the semiconductor channel regions 102-1 and 102-2 are not in contact with the guidance zone 103.

For example, the thickness of the plateau section 1033 along the vertical direction Z amounts to less than 1000 nm, to less than 500 nm, or to less than 100 nm, to less than 50 nm, or to even less than 40 nm. The thickness of the plateau section 1033 may be chosen in dependence of the mean dopant concentration in the plateau section 1033 in order to reach a specific integral dopant concentration along the vertical direction Z. For example, a comparatively high dopant concentration may allow for a comparatively slim plateau section 1033. A comparatively low dopant concentration may yield a comparatively thick plateau section 1033.

For example, the contact section 1031 is in contact with a first load terminal and exhibits a total vertical extension that amounts to less than 25% of the total extension of the first trench 13-1 along the vertical direction Z. For example, the contact section 1031 extends at least as deep along the vertical direction Z as the source regions 101-1, 101-2. The bar section 1032 may be arranged below the contact section 1031 and couple the contact section 1031 to the plateau section 1033. For example, the contact section 1031 and/or the first and second source sections 101-1 and 101-2 may extend into the material of the first load terminal 11 along a direction in parallel to the vertical direction Z for more than 0 nm or for more than the mean distance along the first lateral direction X between the inner ones of the trench sidewalls 133-1 and 133-2.

Figure 2:
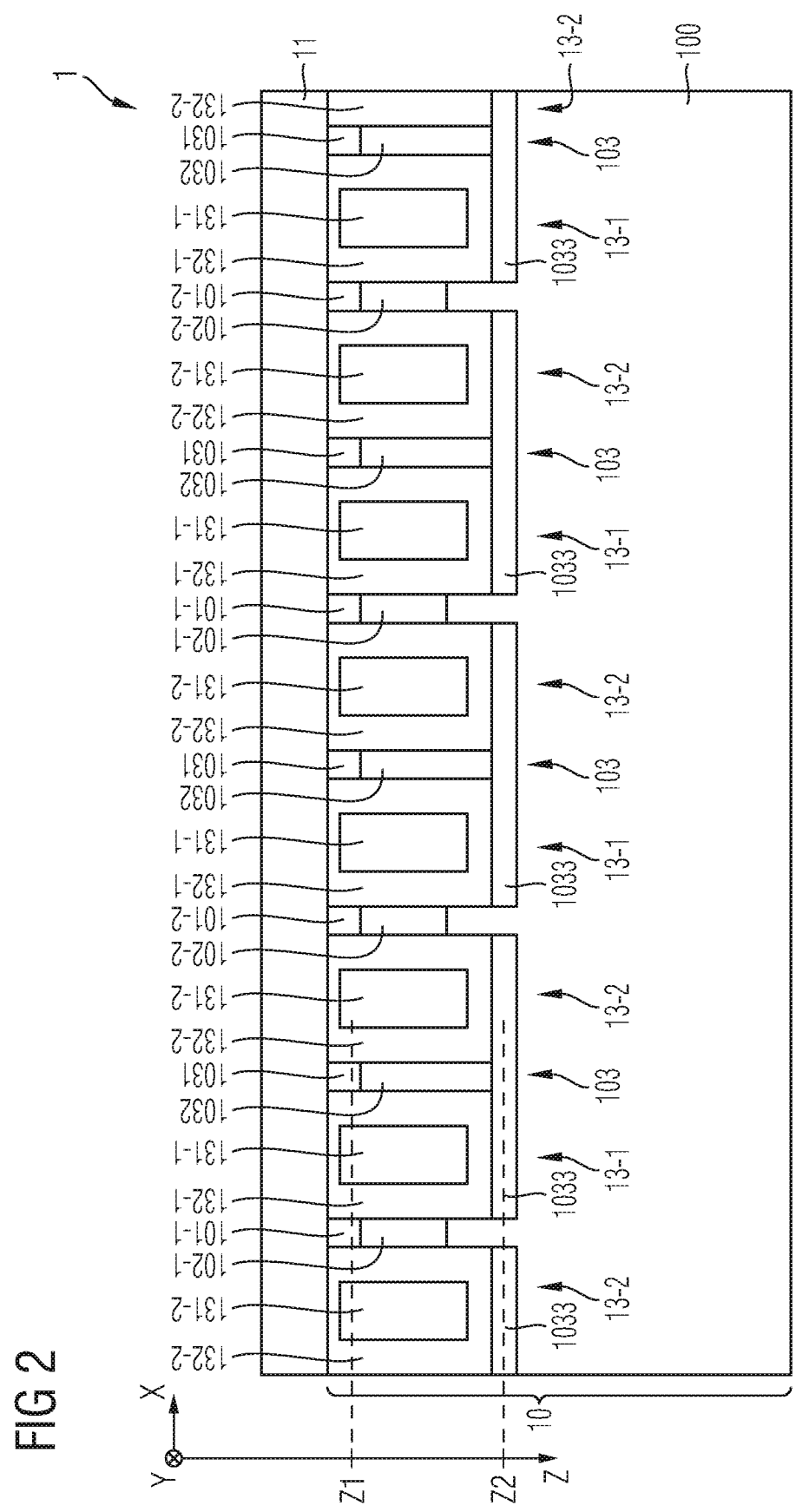
FIG. 2 schematically illustrates a section of a vertical cross-section of a power semiconductor transistor in accordance with one or more embodiments.

Regarding now in more detail the embodiment schematically illustrated in FIG. 2, the transistor 1 may comprise a plurality of pairs of trenches 13-1, 13-2 arranged laterally adjacent to each other along the first lateral direction X. The inner trench sidewalls of each trench pair can be laterally coupled to each other by means of the respective guidance zone 103, e.g., by means of the respective contact section 1031 and the respective bar section 1032.

The contact sections 1031 can be electrically connected to the first load terminal 11, which may comprise, as indicated above, a frontside metallization layer.

Adjacent to the outer trench sidewalls of each trench pair 13-1, 13-2, there may be arranged the first and second source region 101-1 and 101-2 and the first and second semiconductor channel regions 102-1 and 102-2. As illustrated in FIG. 2, adjacent trench pairs may share the first source region 101-1 or, respectively, the second source region 101-2, and the first semiconductor channel region 102-1 or, respectively, the second semiconductor channel region 102-2. The trenches 13-1 and 13-2 of all trench pairs may exhibit the substantially same configuration, e.g., the same trench depth, the same trench width and substantially identical spatial dimensions regarding the control electrodes 131-1, 131-2 and the insulator 132-1, 132-2.

For example, as illustrated in FIG. 2, the bar sections 1032 may extend along the vertical direction Z as far as the trenches 13-1 and 13-2. The plateau sections 1033 may be in contact with respective insulators 132-1 and 132-2 and may extend along the first lateral direction X from one of the outer trench sidewalls to the other of the outer trench sidewalls of the respective trench pair 13-1, 13-2.

For example, adjacent plateau sections 1033 may be isolated from each other by means of the drift region 100 such that a path starting from the first semiconductor channel region 102-1 or, respectively, the second semiconductor channel region 102-2, along the vertical direction Z does not traverse the guidance zone 103.

As further illustrated in FIG. 2, the control electrodes 131-1 and 131-2 may exhibit a total extension along the vertical direction Z that is greater than the total extension along the first lateral direction X. But, in other instances, the widths of the control electrodes 131-1 and 131-2 can be increased.

Figure 3:
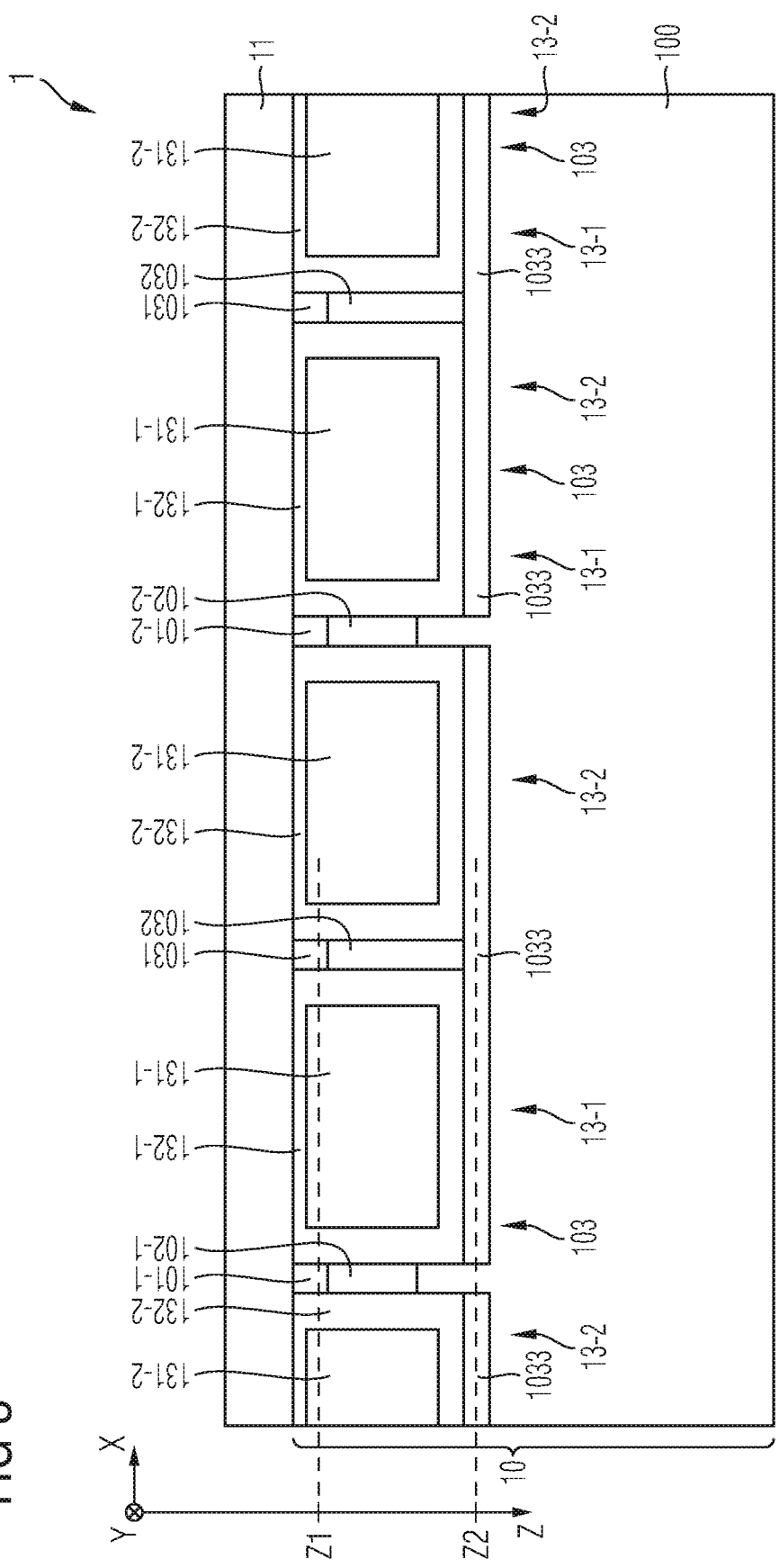
FIG. 3 schematically illustrates a section of a vertical cross-section of a power semiconductor transistor in accordance with one or more embodiments.

For example, in accordance with the embodiment that is schematically illustrated in FIG. 3, the widths of the control electrodes 131-1, 131-2, i.e., the total extensions along the first lateral direction X, may be greater than the total extensions along the vertical direction Z. In an embodiment, the widths of the control electrodes 131-1 and 131-2 are, e.g., within the range from 50 nm to 5000 nm. For example, such increased widths of the control electrodes 131-1 and 131-2 may yield a lower ohmic resistance of the control electrodes 131-1 and 131-2. Even if the widths of the control electrodes 131-1 and 131-2 are increased, the distances between the lateral extremities of the plateau section 1033 of the guidance zone 103 and the semiconductor channel regions 102-1, 102-2 can be kept low, e.g., the distances are not greater as compared to the embodiment schematically illustrated in FIG. 2 which may have control electrodes 131-1 and 131-2 exhibiting a comparatively small width of, e.g., 50 nm to 250 nm.

Figure 4:
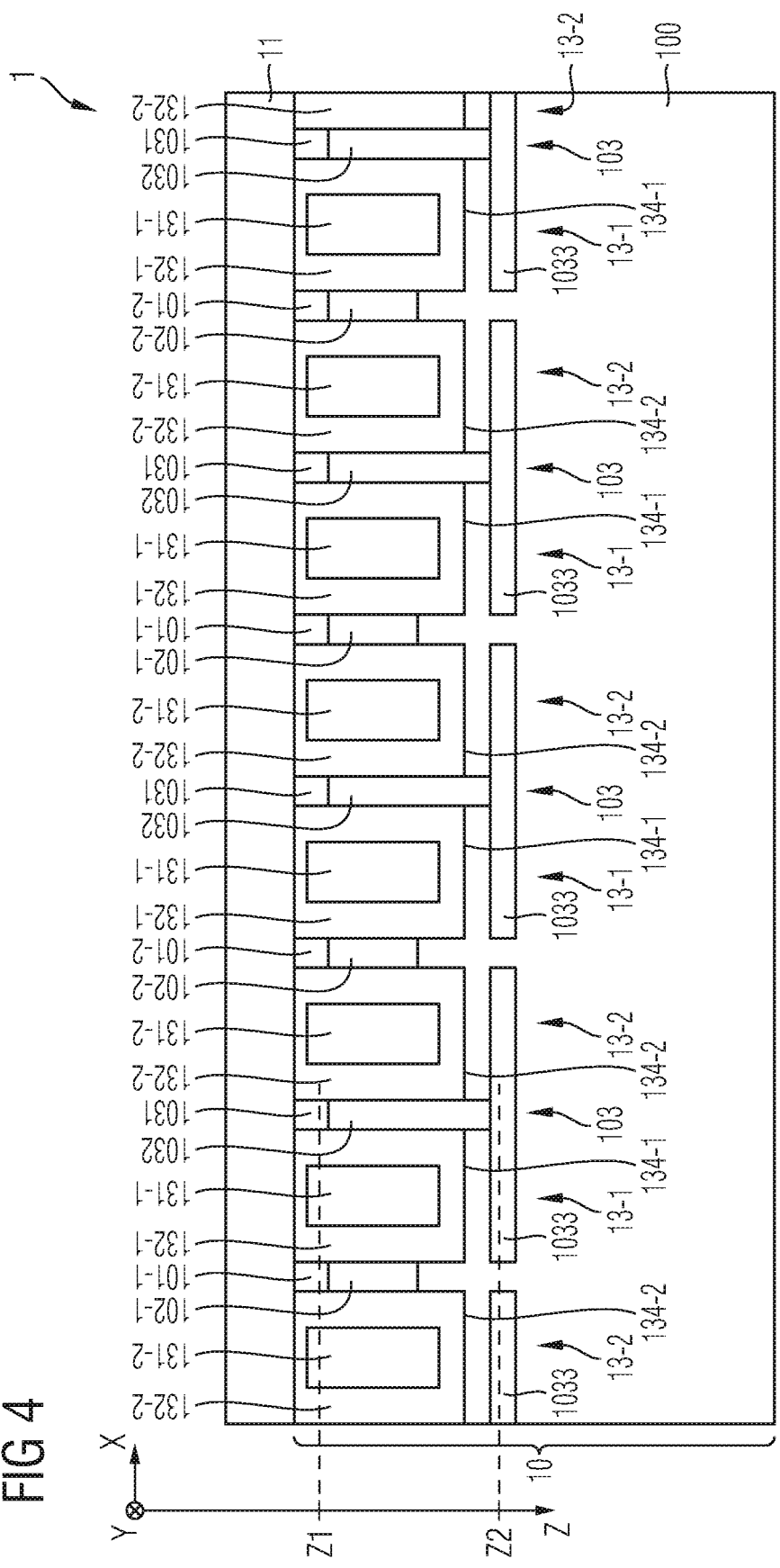
FIG. 4 schematically illustrates a section of a vertical cross-section of a power semiconductor transistor in accordance with one or more embodiments.
Figure 5A:
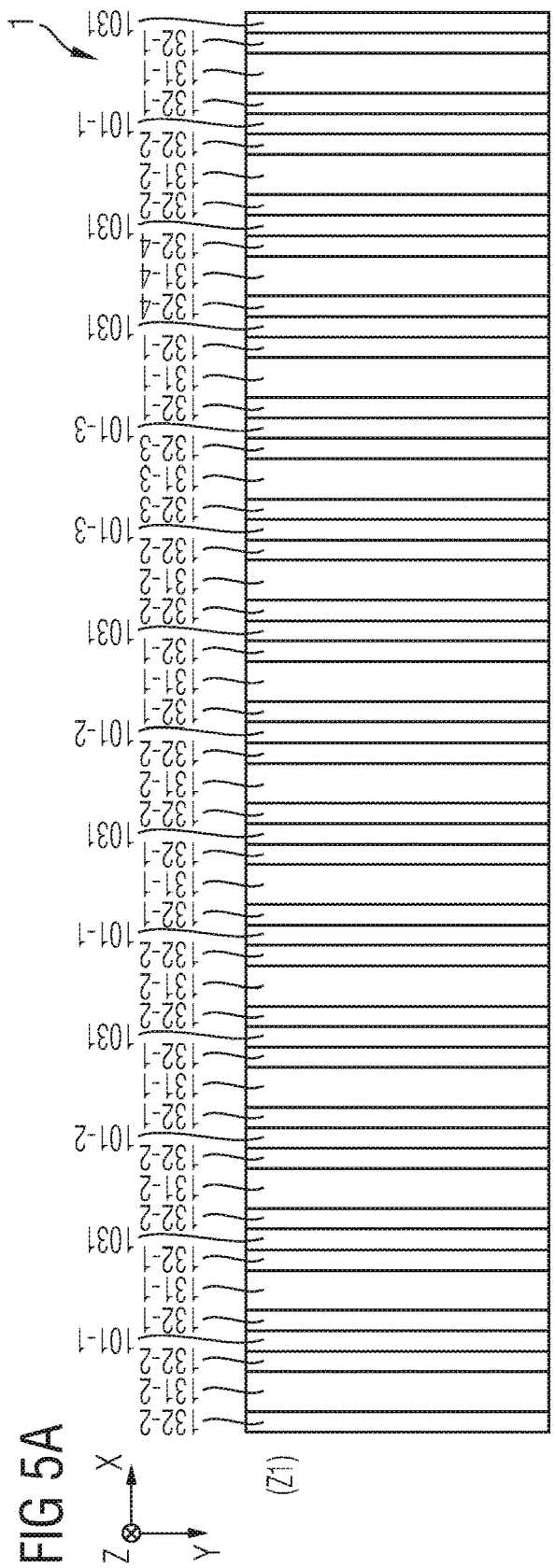
FIGS. 5A-5B schematically illustrate sections of two horizontal cross-sections of a power semiconductor transistor in accordance with several embodiments.
Figure 5B:
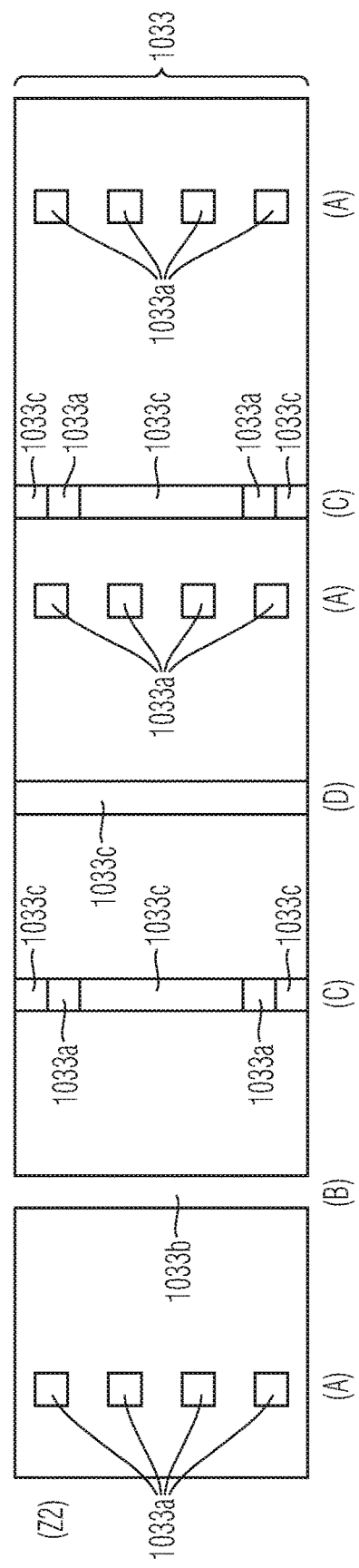

In accordance with the embodiments schematically illustrated in FIG. 4, the bar sections 1032 may extend further along the vertical direction Z than the adjacent trench bottoms 134-1, 134-2 and, accordingly, the plateau sections 1033 may be arranged spatially displaced from each of the first trench bottom 134-1 and the second trench bottom 134-2 of the respective trench pair 13-1, 13-2. For example, the trenches 13-1 and 13-2 of each trench pair are isolated from their associated plateau section 1033 by means of the drift region 100. For example, a distance along the vertical direction Z between the trench bottoms 134-1 and 134-2 and the plateau section 1033 amounts to less 500 nm, to less 200 nm, to less than 100 nm or to even less than 50 nm.

FIGS. 5A-5B schematically illustrate sections of two horizontal cross-sections of the transistor 1 in accordance with several embodiments. FIG. 5A schematically illustrates a section at a depth Z1 (cf. FIG. 2-4) that is within a range that each of the source regions 101-1, 101-2, the contact sections 1033 of the guidance zones 103, the control electrodes 131-1, 131-2 and the insulators 132-1, 132-2 have in common.

As illustrated, the periodicity of said components of the transistor 1 along the first lateral direction X can be realized in different ways. It shall, however, be understood that in an exemplarily embodiment of the transistor 1, only one type of periodicity may be chosen; i.e., the periodicity of the lateral arrangement of said components must not necessarily change but can remain constant for said embodiment. Nevertheless, for the sake of a simple illustration, FIG. 5A shows different possibilities in a common drawing.

For example, according to a first embodiment as shown in the left part of FIG. 5A, the first trench 13-1 having the first control electrode 131-1 and the first insulator 132-1 may be laterally neighbored by said first source region 101-1 on the one side and, on the other side, by said contact section 1031 of the guidance zone 103.

According to a second embodiment as shown in the right part of FIG. 5A, however, a trench including a control electrode electrically insulated for the semiconductor body 10 by an insulator may also be laterally neighbored by a respective source region on each side. Within the present specification, a control electrode included in such a trench is referred to as third control electrode 131-3 and source regions adjacent to such a trench are referred to as third source regions 101-3 and the corresponding insulator is referred to as third insulator 132-3. It shall be understood that the third source regions 101-3, the third insulator 132-3, the third control electrode 131-3 may otherwise exhibit the same features as the first and second source regions 101-1 and 101-2 as described above, e.g., features regarding spatial dimensions, dopant concentrations, dopant types and the electrical connection to the first load terminal 11. Accordingly, the third control electrode 131-3 may be electrically connected to further control electrodes. Further, below the third source regions 101-3, there may be arranged corresponding third semiconductor channel regions (not illustrated).

According to a third embodiment as shown in the right part of FIG. 5A; a trench having a control electrode electrically insulated from the semiconductor body 10 by an insulator may also be laterally neighbored by two contact sections 1031 of guidance zones 103, Within this specification, such control electrode is referred to as fourth electrode 131-4 and such insulator is referred to as fourth insulator 132-4. It shall be understood that what has been stated with regards to the first, second and third control electrodes 131-1 to 131-3 and with regards to the first, second and third insulators 132-1 to 132-3 may equally apply to the fourth control electrode 131-4 and the fourth insulator 131-4.

In accordance with a further embodiment, the lateral neighborhood relationship of the source regions, control electrodes and contact sections may differ from the exemplary possibilities illustrated in FIG. 5A. To give just two examples, a group of several control electrode trenches arranged laterally adjacent to each other may be laterally flanked by two source regions, wherein in between each two trenches of the group of trenches that are neighbored to each other there may be provided a contact section of a guidance zone. Or, a group of several control electrode trenches arranged laterally adjacent to each other may be laterally flanked by two contact sections of a guidance zone, wherein in between each two trenches of the group of trenches that are neighbored to each other there may be provided a source region. Yet other variations of the periodicity of the lateral arrangement of the trenches including a respective control electrode, the source regions and the contact sections of the guidance zone are possible.

Regarding now in more detail FIG. 5B, which schematically illustrates sections of horizontal cross-sections of several embodiments of the transistor 1 at a deeper level Z2 (cf. FIG. 2-4), exemplary configurations (A) to (D) of the plateau sections 1033 of the guidance zones 103 shall now be presented. It shall be understood that within one exemplarily embodiment of the transistor 1; one of the variants (A) to (D) described below may be chosen; i.e., the configurations of all or most of all the plateau sections 1033 within said embodiment can be substantially identical to each other. Further, it shall be understood that variants (A) to (D) described below are not necessarily linked to the different types of periodicity of the lateral arrangement of the source regions, contact sections and control electrodes that have been explained with respect to FIG. 5A; rather, the exemplary configurations (A) to (D) of the plateau sections 1033 can be independent of a chosen periodicity. Nevertheless, the exemplary configurations (A) to (D) of the plateau sections 1033 are depicted in a common drawing FIG. 5B that is aligned to FIG. 5A for illustrating more clearly exemplary lateral extensions of the plateau sections 1033 with respect to one or more of the source regions arranged above thereof.

Each plateau section 1033 may be coupled to the associated contact section 1031 by means of said bar section 1032.

In accordance with variant (A), the plateau section 1033 may comprise one or more openings 1033a below the source region (101-1, 101-2 and/or 101-3). For example, such opening 1033a may exhibit a rectangular shape or, respectively, a circular shape in the horizontal cross-section. Said openings 1033a may also exhibit a shape different from the ones illustrated in FIG. 5B, such as rectangular shape having rounded corners or a polygon shape, to name a few. As illustrated, the one or more openings 1033a of the plateau section 1033 may be spatially displaced from each other such that there are regions below the source region (101-1, 101-2 and/or 101-3) that are covered by the plateau section 1033. For example, in accordance with variant (A), the dopant concentration is substantially constant along each of the first lateral direction X and the second lateral direction Y, except for the openings 1033a, which may be filled by the drift region 100.

In accordance with variant (B), the plateau section 1033 may be completely interrupted below the source region (101-1, 101-2 and/or 101-3). This interruption 1033b of the plateau section 1033 may be filled, e.g., by the drift region 100.

In accordance with variant (C), in the region below the source region (101-1, 101-2 and/or 101-3), the plateau section 1033 may comprise one or more openings 1033a that may be covered by the drift region 100 and one or more regions 1033c having a locally reduced dopant concentration as compared to the remaining part of the plateau section 1033. For example, the dopant concentration of the one or more regions 1033c amounts, e.g., to less than 50%, 25% or to even less than 10% of the dopant concentration of the remaining parts of the plateau section 1033.

In accordance with variant (D), below the source region (101-1, 101-2 and/or 101-3), the plateau section 1033 does not exhibit any openings, but the region 1033c having the locally reduced dopant concentration that is lower as compared to the remaining parts of the plateau sections 1033. Thus, adjacent pairs of trenches 13-1, 13-2 may have a common plateau section 1033.

In accordance with yet a further variant that is not illustrated in FIG. 5B, the dopant concentration of the plateau section 1033 may be substantially constant along the first lateral direction X, even when trespassing two or more adjacent trench pairs 13-1, 13-2. Thus, the guidance zones 103 of two or more trench pairs 13-1, 13-2 may have a common plateau section 1033 that is not interrupted or, respectively, does not exhibit a change of dopant concentration along the first lateral direction X when traversing the region below the source region (101-1, 101-2 and/or 101-3). Such common plateau section may form a plateau layer.

For example, in contrast to the schematic illustrations of the vertical cross-sections in FIGS. 2 to 4, the plateau sections 1033 of the guidance zones 103 may also be formed by a contiguous plateau layer that is not interrupted, below the source regions (101-1, 101-2 and/or 101-3), by the drift region 100. For example, the dopant concentration of said plateau layer is substantially constant in each of the first lateral direction X and the second lateral direction Y.

For example, the openings 1033a may be laterally aligned to the source regions (101-1, 101-2 and/or 101-3) arranged above thereof. Thus, the width of one or more of the openings 1033a in the first and/or second lateral direction X, Y may be the same as the width of one of the source region in the first and/or second lateral direction X, Y arranged above thereof. According to another example, the width of one or more of the openings 1033a in the first and/or second lateral direction X, Y may be smaller and/or larger than the width of the source region in the first and/or second lateral direction X, Y arranged above thereof.

Further, regarding variant (B), the width of the interruption 1033b in the first lateral direction X may exceed the width of the source region arranged above thereof in the first lateral direction X, e.g., by more than 20 nm, 50 nm, 100 nm, 200 nm. It should be noted that the vertical alignment of the openings 1033a to the source regions arranged above thereof may exhibit lateral shifts in the first and/or second lateral direction X, Y, e.g., due to alignment errors in the processing.

FIG. 6 schematically illustrates exemplary embodiments of the guidance zone 103. As has been explained above, the guidance zone 103 may comprise the contact section 1031, the bar section 1032 and the plateau section 1033. As has further been explained with respect to FIG. 5B, the plateau section 1033 may not necessarily be interrupted below the first source regions 101-1, 101-2 and/or 101-3, which means that adjacent guidance zones 103 may have a common plateau section 1033, e.g., said plateau layer.

The contact section 1031 may be electrically connected to the first load terminal 11 and may extend along the vertical direction Z until a depth Za, which may amount to e.g., less than 20% of the total extension of the neighboring trench 13-1 (or trench 13-2). For example, the neighboring trenches 13-1, 13-2 (not illustrated in FIG. 6) may extend along the vertical direction Z until a depth Zt.

The bar section 1032 couples the contact section 1031 to the plateau section 1033. As has been explained with regards to FIG. 3 and FIG. 4, the bar section 1032 extends at least as far as or even further than the neighboring trench 13-1 and/or 13-2. Thus, the depth down to which the bar section 1032 extends (which is labelled Zb in FIG. 6) may be equal to or greater than the depth level Zt.

The plateau section 1033 may extend along the vertical direction 1033 down to a depth level Zc. As has been explained above, the thickness of the plateau section 1033, i.e., the difference between Zc and Zb, may be less than 1000 nm.

In the following, exemplary profiles of the dopant concentration CC of the guidance zone 103 along the vertical direction Z shall be presented with respect to variants (1) to (4) illustrated in FIG. 6.

For example, in accordance with all variants (1) to (4), the dopant concentration of the contact section 1031 may be substantially constant along at least 80% of the total extension of the contact section 1031 along the vertical direction Z and may amount to CC1, wherein CC1 may be higher than $10^{16}$ cm$^{-3}$, e.g., within a range of $10^{18}$ cm$^{-3}$ to $10^{21}$ cm$^{-3}$. At a transition from the contact section 1031 to the bar section 1032 along the vertical direction Z, the dopant concentration CC may drop down to a level CC2, which may be, e.g., in the range of $10^{11}$ cm$^{-3}$ to $10^{19}$ cm$^{-3}$, wherein CC1 may be at least one order of magnitude greater than CC2. For example, the dopant concentration of the bar section 1032 remains substantially constant along at least 20% of the total extension of the bar section 1032 along the vertical direction Z at the level CC2, e.g., until the trench bottoms 134-1 and/or 134-2 of the neighboring trenches 13-1 and/or 13-2 are reached.

In accordance with variants (1) to (3), the dopant concentration of the bar section 1032 remains substantially constant until the transition to the plateau section 1033 is reached, which may be, as has been explained above, even below the trench bottoms 134-1, 134-2.

For example, in accordance with variant (1), the dopant concentration at the transition to the plateau section 1033 increases up to a level CC3, which may be within a range of $10^{16}$ cm$^{-3}$ to $10^{19}$ cm$^{-3}$. For example, the dopant concentration of the plateau section 1033 is substantially constant along at least 50% of the total extension of the plateau section along the vertical direction Z. According to another example, the dopant concentration of the plateau section 1033 may have a varying concentration along the vertical direction Z, e.g., a substantially Gaussian characteristic or a constant doping and a substantially Gaussian characteristic towards the drift region 100 and/or the bar section 1032. For example, the plateau section (1033) has a dopant concentration that varies along the vertical direction (Z) by a factor of at least ten.

Regarding variant (2), the dopant concentration of the plateau section 1033 may increase gradually along at least 80% of the total extension of the plateau section 1033 along the vertical direction Z, e.g., up to the value CC3, starting from the value CC2 at the transition to the plateau section 1033.

In accordance with variant (3), the dopant concentration of the guidance zone may increase to the level CC3 at the transition between the bar section 1032 and the plateau section 1033 and then gradually decrease along the vertical direction Z.

In accordance with variant (4), the bar section 1032 extends further along the vertical direction Z than the neighboring trenches 13-1 and/or 13-2. For example, in the region of the bar section 1032 that is arranged deeper than the neighboring trench 13-1 and/or 13-2, the dopant concentration of the bar section 1032 exhibits a Gaussian course, as schematically illustrated in FIG. 6. Further, also the dopant concentration of the plateau section 1033 may exhibit a Gaussian course along the vertical direction Z.

In accordance with all variants, the dopant concentration of the plateau section 1033, except for the optionally included openings 1033a, regions 1033c having the locally reduced dopant concentration and/or interruptions 1033b mentioned above with respect to FIG. 5B, may be substantially constant along the first lateral direction X, e.g., along at least 80% of the total extension of the plateau section 1033 along the first lateral direction X.

The embodiments schematically illustrated in FIG. 1 to FIG. 6 and described above include the recognition that, during a blocking state of a transistor having a fully depleted channel region, by means of the plateau section, the electrical potential of the first load terminal may be guided into a direction towards a bottom of an adjacent channel region, such that a voltage difference along a lateral direction between the guidance zone and the channel region may be reduced. Thereby, the risk of latching can be reduced in accordance with one or more embodiments. For example, during a transition from the conducting state to the blocking state, which may be induced by the corresponding change of the voltage between the control electrode and the first load terminal, charge carriers may be effectively deducted to the first load terminal, even if the control electrode may be still on a slightly positive potential, e.g., during begin of the turn-off process. For example, the plateau section mentioned above may allow for a variation of the distance along the first lateral direction between the guidance zone and the source region, since irrespectively of said distance the distance between the bottom of the channel region and the plateau section can be kept low.

Features of further embodiments are defined in the dependent claims. The features of further embodiments and the features of the embodiments described above may be combined with each other for forming additional embodiments, as long as the features are not explicitly described as being alternative to each other.

In the above, embodiments pertaining to a power semiconductor transistor and to methods of processing a power semiconductor transistor were explained. For example, these embodiments are based on silicon (Si). Accordingly, a monocrystalline semiconductor region or layer, e.g., the semiconductor regions 10, 100, 101-1, 101-2, 101-3, 102-1, 102-2, 103, 1031, 1032, 1033 of exemplary embodiments, can be a monocrystalline Si-region or Si-layer. In other embodiments, polycrystalline or amorphous silicon may be employed.

It should, however, be understood that the semiconductor regions 10, 100, 101-1, 101-2, 101-3, 102-1, 102-2, 103, 1031, 1032, 1033 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SIC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-Site heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor transistor, comprising:
   a semiconductor body coupled to a first load terminal;
   a semiconductor drift region in the semiconductor body and having dopants of a first conductivity type;
   a first trench extending into the semiconductor body along a vertical direction, the first trench including a control electrode electrically insulated from the semiconductor body by an insulator, the first trench having a first sidewall, a second sidewall, and a bottom;
   a second trench extending into the semiconductor body along the vertical direction;
   a source region of the first conductivity type laterally adjacent the first sidewall of the first trench and electrically connected to the first load terminal;
   a semiconductor channel region separating the source region from the semiconductor drift region; and
   a guidance zone electrically connected to the first load terminal and arranged separately from each semiconductor channel region of the power semiconductor transistor, the guidance zone comprising a contact section of a second conductivity type, a bar section of the second conductivity type, and a plateau section of the second conductivity type,
   wherein the contact section is in contact with the first load terminal,
   wherein the bar section extends along a sidewall of the second trench in the vertical direction,
   wherein the bar section couples the contact section to the plateau section,
   wherein the plateau section is arranged below the bottom of the first trench and extends laterally towards the semiconductor channel region,
   wherein the first trench and the plateau section have a common lateral extension range of at least 75% of a total extension of the first trench along a first lateral direction,
   wherein a distance along the first lateral direction between a sidewall of the first trench and a sidewall of the second trench is less than 100 nm.

2. The power semiconductor transistor of claim 1, wherein the contact section is devoid of a source zone in contact with the guidance zone.

3. The power semiconductor transistor of claim 1, wherein the semiconductor channel region is fully depleted by setting the control electrode to an appropriate voltage.

4. The power semiconductor transistor of claim 1, wherein the first trench and the second trench are formed as parallel stripe-shaped trenches.

5. The power semiconductor transistor of claim 1, wherein the first load terminal is arranged on a frontside of the semiconductor body and includes a first metallization layer in contact with the source region.

6. The power semiconductor transistor of claim 1, wherein the guidance zone is configured to guide an electrical potential of the first load terminal to lateral extremities of the plateau section and to a vertical extremity of the plateau section.

7. The power semiconductor transistor of claim 1, wherein the bar section is arranged below the contact section.

8. The power semiconductor transistor of claim 1, wherein the bar section extends along the vertical direction as far as the first trench and the second trench.

9. The power semiconductor transistor of claim 1, wherein the bar section extends along the vertical direction further than the first trench and the second trench, and wherein the plateau section is arranged spatially displaced from the bottom of the first trench or the second trench.

10. The power semiconductor transistor of claim 1, wherein below the semiconductor channel region, the plateau section includes one or more regions having a locally reduced dopant concentration as compared to remaining parts of the plateau section.

11. The power semiconductor transistor of claim 10, wherein the dopant concentration of the one or more regions of the plateau section having the locally reduced dopant concentration is less than 50% of the dopant concentration of the remaining parts of the plateau section.

12. A power semiconductor transistor, comprising:
    a semiconductor body coupled to a first load terminal;
    a semiconductor drift region in the semiconductor body and having dopants of a first conductivity type;
    a first trench extending into the semiconductor body along a vertical direction, the first trench including a control electrode electrically insulated from the semiconductor body by an insulator, the first trench having a first sidewall, a second sidewall opposite the first sidewall and a bottom;
    a second trench extending into the semiconductor body along the vertical direction;
    a source region of the first conductivity type laterally adjacent the first sidewall of the first trench and electrically connected to the first load terminal;
    a semiconductor channel region separating the source region from the semiconductor drift region; and
    a guidance zone electrically connected to the first load terminal and arranged separately from each semiconductor channel region of the power semiconductor transistor, the guidance zone comprising a contact section of a second conductivity type, a bar section of the second conductivity type, and a plateau section of the second conductivity type,
    wherein during a blocking state of the power semiconductor transistor, the plateau section is configured to guide an electrical potential of the first load terminal into a direction towards a bottom of the semiconductor channel region, such that a voltage difference along a lateral direction between the guidance zone and the semiconductor channel region is reduced.

13. The power semiconductor transistor of claim 12, wherein the plateau section is configured to allow for a variation of a distance along a lateral direction between the guidance zone and the source region.

14. The power semiconductor transistor of claim 12, wherein the contact section is devoid of a source zone in contact with the guidance zone.

15. The power semiconductor transistor of claim 12, wherein the semiconductor channel region is fully depleted by setting the control electrode to an appropriate voltage.

16. The power semiconductor transistor of claim 12, wherein the guidance zone is configured to guide an electrical potential of the first load terminal to lateral extremities of the plateau section and to a vertical extremity of the plateau section.

17. The power semiconductor transistor of claim 12, wherein the bar section is arranged below the contact section.

18. The power semiconductor transistor of claim 12, wherein the bar section extends along the vertical direction as far as the first trench and the second trench.

19. The power semiconductor transistor of claim 12, wherein the bar section extends along the vertical direction further than the first trench and the second trench, and wherein the plateau section is arranged spatially displaced from the bottom of the first trench or the second trench.

20. The power semiconductor transistor of claim 12, wherein below the semiconductor channel region, the plateau section includes one or more regions having a locally reduced dopant concentration as compared to remaining parts of the plateau section.

* * * * *